(12) United States Patent
Kim et al.

(10) Patent No.: US 7,804,129 B2
(45) Date of Patent: Sep. 28, 2010

(54) RECESSED GATE ELECTRODE MOS TRANSISTOR AND METHOD FOR FABRICATING THE SAME

(75) Inventors: Jun Ki Kim, Kyoungki-do (KR); Soo Hyun Kim, Seoul (KR); Hyun Chul Sohn, Seoul (KR); Se Aug Jang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 108 days.

(21) Appl. No.: 11/157,999

(22) Filed: Jun. 21, 2005

(65) Prior Publication Data

US 2006/0273381 A1   Dec. 7, 2006

(30) Foreign Application Priority Data

Apr. 29, 2005   (KR) .................. 10-2005-0036051

(51) Int. Cl.
*H01L 29/76* (2006.01)
*H01L 21/3205* (2006.01)

(52) U.S. Cl. ................ 257/330; 257/E21.553; 438/589

(58) Field of Classification Search .......... 438/589; 257/330
See application file for complete search history.

(56) References Cited

U.S. PATENT DOCUMENTS

| | | | |
|---|---|---|---|
| 5,492,858 A * | 2/1996 | Bose et al. ............ 438/437 |
| 5,940,717 A * | 8/1999 | Rengarajan et al. ......... 438/435 |
| 6,420,249 B1 | 7/2002 | Doan et al. |
| 2002/0109102 A1* | 8/2002 | Steklenski et al. ....... 250/484.4 |
| 2004/0072412 A1* | 4/2004 | Kim ........................ 438/589 |
| 2005/0173759 A1* | 8/2005 | Kim et al. .................. 257/331 |
| 2006/0226455 A1* | 10/2006 | Lee et al. ................... 257/288 |

FOREIGN PATENT DOCUMENTS

| KR | 1020040099533 | 12/2004 |
|---|---|---|
| KR | 1020040099533 A * | 12/2004 |

OTHER PUBLICATIONS

Korean Patent Gazette, Jul. 4, 2006.

* cited by examiner

*Primary Examiner*—Wael M Fahmy
*Assistant Examiner*—Sarah K Salerno
(74) *Attorney, Agent, or Firm*—Ladas & Parry LLP

(57) ABSTRACT

Disclosed are a transistor and a method for fabricating the same capable of increasing a threshold voltage and a driving current of the transistor. The method includes the steps of forming a first etch mask on a silicon substrate, forming a trench by etching the exposed isolation area, forming a first insulation layer in the trench and the first etch mask, forming a second insulation layer on the first insulation layer, removing the second insulation layer and the first insulation layer until the first etch mask is exposed, forming a trench type isolation layer on the isolation area, forming a second etch mask on an entire surface of the silicon substrate, etching the exposed channel area, performing an etching process with respect to a resultant substrate structure, and forming a gate in the recess.

7 Claims, 5 Drawing Sheets

RECESSED GATE ELECTRODE MOS TRANSISTOR AND METHOD FOR FABRICATING THE SAME

BACKGROUND OF THE INVENTION

1. Field of the Invention

The present invention relates to a method for fabricating a semiconductor device. More particularly, the present invention relates to a transistor and a method for fabricating the same, capable of increasing a driving current while raising a threshold voltage.

2. Description of the Prior Art

Recently, as semiconductor devices have been highly integrated, channel lengths of transistors are significantly shortened. Such a phenomenon may occur in a DRAM cell, so that a short channel effect causing a threshold voltage to be significantly lowered is seriously represented in a planar transistor structure.

If the threshold voltage of a transistor becomes lowered, a relatively great amount of current is leaked through channels of the transistor even if the transistor is not turned on, so electric charges stored in a DRAM capacitor are gradually discharged, thereby causing data loss.

In order to solve the above problem, Vt implantation (threshold voltage ion implantation) is carried out to implant B or $BF_2$ into a silicon substrate. In general, the Vt implantation must be performed while increasing the density of B or $BF_2$ as a width of a semiconductor device becomes narrowed.

However, if the Vt implantation is carried out while increasing the density of B or $BF_2$, a width of a depletion region connected to a junction region becomes reduced, so that an electric field applied to the depletion region is increased, thereby increasing the junction leakage current.

Thus, it is necessary for a DRAM device to develop a technique capable of stably storing electric charges in a capacitor even if the channel width of the transistor becomes reduced. To this end, there has been suggested a technique for enlarging a channel length, in which a predetermined portion of a silicon substrate corresponding to a channel area of a transistor is etched by a predetermined depth in order to enlarge the channel length.

FIG. 1 is a plan view illustrating a transistor having a recess gate structure, in which a silicon substrate is etched so as to enlarge a channel length, and FIGS. 2 and 3 are sectional views taken along lines II-II and III-III shown in FIG. 1, respectively. Reference numerals 1 to 4 represent a silicon substrate, an isolation layer, a recess gate and a junction area, respectively.

However, the transistor having the recess gate causes higher back bias dependency of a threshold voltage so that the threshold voltage may easily vary even if the back bias shows little variation. For this reason, the transistor having the recess gate may not ensure operational reliability thereof.

Another problem may occur with the increase of the integration degree of the semiconductor device. That is, the driving current of the transistor may be reduced as the width of the transistor becomes narrowed. In order to improve the driving current of a two-dimensional transistor, a fin FET (field effect transistor) structure, in which a predetermined portion of a silicon substrate is protruded as shown in FIG. 4, has been developed.

According to the fin FET structure, three surfaces of the protruded silicon substrate are used as channels for the transistor, so that the driving current of the transistor can be increased while lowering the back bias dependency of the threshold voltage. In FIG. 4, reference numerals 41, 43 and 44 represent a silicon substrate, a gate and a junction area, respectively.

However, if the fin FET structure is applied to the DRAM device, data retention time may be shortened.

In short, the conventional recess gate structure and fin FET structure may present limitations to increase the driving current while raising the threshold voltage.

SUMMARY OF THE INVENTION

Accordingly, the present invention has been made to solve the above-mentioned problems occurring in the prior art, and an object of the present invention is to provide a transistor and a method for fabricating the same, capable of effectively raising a threshold voltage while increasing a driving current of the transistor.

In order to accomplish the above object, according to one aspect of the present invention, there is provided a transistor comprising: a silicon substrate having an active area and an isolation area and being formed at a predetermined portion of the active area to be determined as a channel area with a recess; a trench type isolation layer formed in the isolation area of the silicon substrate and including a trench, a first insulation layer formed on a bottom and a lower sidewall of the trench and a second insulation layer formed on the first insulation layer in such a manner that the trench is filled with the second insulation layer; and a gate formed in the recess, wherein the recess has a depth smaller than a depth of the trench, an end of the first insulation layer is aligned at a lower end portion of the trench so that the first insulation layer is positioned lower than a bottom of the recess, and the gate is formed in the recess and the first insulation layer so that a channel length and a channel width of the transistor are increased corresponding to the gate formed on the first insulation layer.

The trench has the depth of about 2000 to 3500 Å.

The first insulation layer includes a nitride layer having a thickness of about 100 to 600 Å.

The first insulation layer has a stacked structure including an oxide layer and a nitride layer. In this case, the oxide layer has a thickness of about 30 to 300 Å and the nitride layer has a thickness of about 20 to 150 Å.

The second insulation layer includes an oxide layer.

The recess has a depth smaller than a depth of the trench by at least 200 Å. Preferably, the recess has a depth corresponding to ½ to ⅘ of a depth of the trench.

The first insulation layer is positioned lower than the bottom of the recess by a distance of about 100 to 1000 Å.

According to another aspect of the present invention, there is provided a method for fabricating a transistor, the method comprising the steps of: forming a first etch mask on a silicon substrate having an active area and an isolation area so as to expose the isolation area; forming a trench by etching the exposed isolation area of the silicon substrate; forming a first insulation layer on a surface of the trench and the first etch mask; forming a second insulation layer on the first insulation layer such that the trench is filled with the second insulation layer; removing the second insulation layer and the first insulation layer until the first etch mask is exposed to an exterior; forming a trench type isolation layer on the isolation area of the silicon substrate by removing the first etch mask; forming a second etch mask on an entire surface of the silicon substrate including the isolation layer such that a channel area to be formed in the active area is exposed through the second etch mask; etching the exposed channel area formed in the active area of the silicon substrate, thereby forming a recess having a depth smaller than a depth of the trench; performing an etching process with respect to a resultant substrate structure, thereby removing a predetermined portion of the first insulation layer formed at a lateral portion of the second insulation layer in the isolation layer, which is exposed through the recess, in such a manner that a remaining part of the first insulation layer is positioned lower than a bottom of the recess; forming a gate in the recess.

The first etch mask has a stacked structure including an oxide layer and a nitride layer.

The trench has the depth of about 2000 to 3500 Å.

The first insulation layer includes a nitride layer having a thickness of about 100 to 600 Å.

The first insulation layer is removed by performing the wet etching process using etchant used for removing a nitride layer. Thus, a remaining part of the first insulation layer is positioned lower than the bottom of the recess by a distance of about 100 to 1000 Å.

The second insulation layer includes the oxide layer which is one selected from the group consisting of an HDP-oxide layer, an $O_3$-TEOS oxide layer and an SOG layer having superior trench-filling characteristics. The oxide layer has a thickness of about 2500 to 6000 Å.

The second etch mask has a stacked structure including an oxide layer and a polysilicon layer.

The recess has a depth smaller than a depth of the trench by at least 200 Å. Preferably, the recess has a depth corresponding to ½ to ⅘ of a depth of the trench.

The method further includes a step of performing an etching process with respect a resultant substrate structure after removing the predetermined portion of the first insulation layer formed at the lateral portion of the second insulation and before the gate is formed in such a manner that corner edges formed at the bottom of the recess are blunted.

The second etch mask is removed while the etching process is being carried out.

The step of forming the recess gate includes the substeps of sequentially forming a gate insulation layer and a gate conductive layer on an entire surface of the silicon substrate including the recess, and etching the gate conductive layer and the gate insulation layer such that predetermined portions of the gate conductive layer and the gate insulation layer remain on the bottom of the recess.

The gate insulation layer is an oxide layer or a nitride layer including one selected from the group consisting of Si, Hf and Al.

The gate conductive layer includes at least one selected from the group consisting of a polysilicon layer, a tungsten layer, a tungsten silicide layer, a titanium nitride layer and a tungsten nitride layer.

According to still another aspect of the present invention, there is provided a method for fabricating a transistor, the method comprising the steps of: forming a first etch mask on a silicon substrate having an active area and an isolation area so as to expose the isolation area; forming a trench by etching the exposed isolation area of the silicon substrate; forming a first insulation layer having a stacked structure of a first oxide layer and a nitride layer on a surface of the trench and the first etch mask; forming a second insulation layer including a second oxide layer on the first insulation layer such that the trench is filled with the second insulation layer; removing the second insulation layer and the first insulation layer until the first etch mask is exposed to an exterior; forming a trench type isolation layer on the isolation area of the silicon substrate by removing the first etch mask; forming a second etch mask on an entire surface of the silicon substrate including the isolation layer such that a channel area to be formed in the active area is exposed through the second etch mask; etching the exposed channel area formed in the active area of the silicon substrate, thereby forming a recess having a depth smaller than a depth of the trench; performing an etching process with respect to a resultant substrate structure, thereby removing a predetermined portion of the first insulation layer formed at a lateral portion of the second insulation layer in the isolation layer, which is exposed through the recess, in such a manner that a remaining part of the first insulation layer is positioned lower than a bottom of the recess; and forming a gate in the recess.

The first oxide layer of the first insulation layer has a thickness of about 30 to 300 Å and the nitride layer of the first insulation layer has a thickness of about 20 to 150 Å.

The second oxide layer of the second insulation layer is one selected from the group consisting of an HDP-oxide layer, an $O_3$-TEOS oxide layer and an SOG layer having superior trench-filling characteristics.

The first oxide layer of the first insulation layer is selectively removed through the wet etching process by using etchant used for removing an oxide layer.

The step of removing the first insulation layer through the etching process includes the substeps of performing a primary wet etching process by using first etchant used for removing an oxide layer and performing a secondary wet etching process by using second etchant used for removing a nitride layer.

A surface of the second insulation layer including the second oxide layer is partially removed while the primary wet etching process is being carried out. Preferably, the second insulation layer including the second oxide layer is partially removed by a thickness of about 100 to 500 Å.

The method further includes a step of performing an etching process with respect a resultant substrate structure after removing the predetermined portion of the first insulation layer formed at the lateral portion of the second insulation and before the gate is formed in such a manner that corner edges formed at the bottom of the recess are blunted.

The second etch mask is removed while the etching process is being carried out.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described with reference to accompanying drawings.

Figure 1:
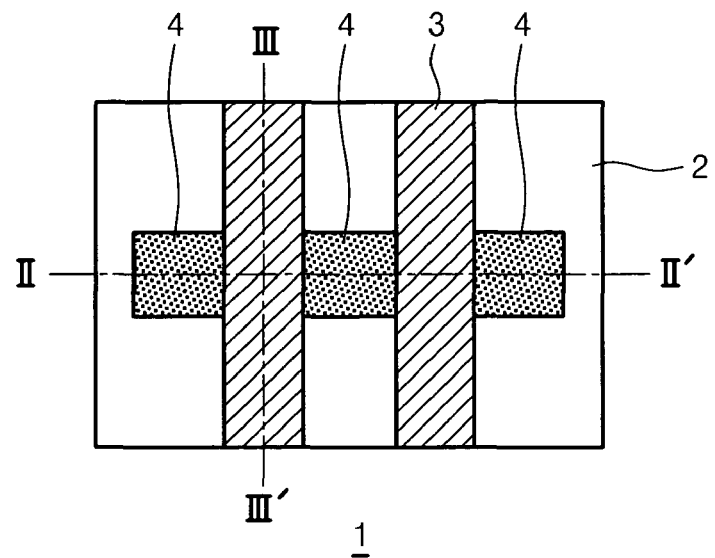
FIG. 1 is a plan view illustrating a transistor having a recess gate structure, in which a silicon substrate is etched so as to enlarge a channel length.
Figure 2:
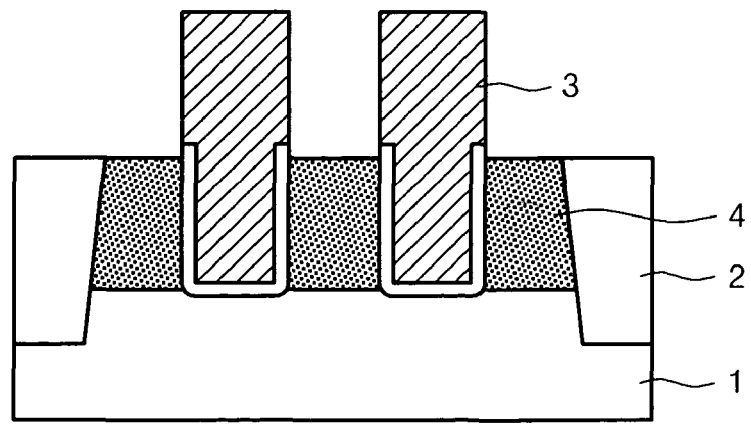
FIGS. 2 and 3 are sectional views taken along lines II-II and III-III shown in FIG. 1, respectively.
Figure 3:
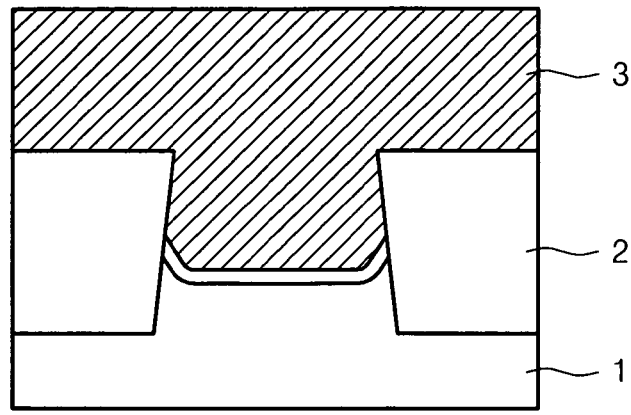
Figure 4:
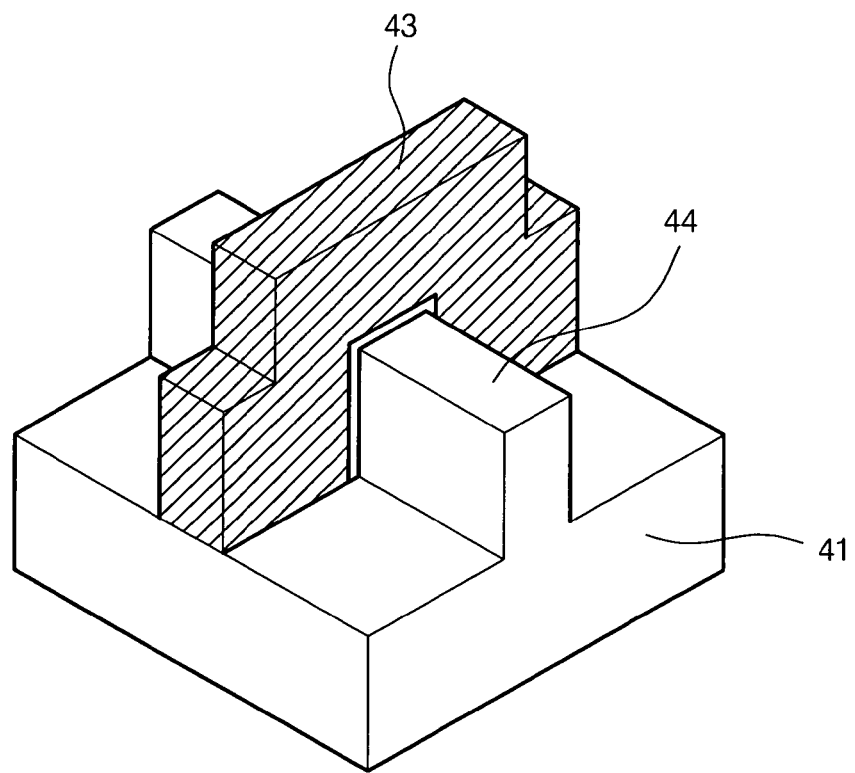
FIG. 4 is a perspective view illustrating a conventional fin FET structure.

FIGS. 5A to 5F are sectional view illustrating a procedure for fabricating a transistor according to one embodiment of the present invention. It should be noted that left parts of FIGS. 5A to 5F are taken along an X-axis direction (II-II) of FIG. 1 and right parts of FIGS. 5A to 5F are taken along a Y-axis direction (III-III) of FIG. 1.

Figure 5A:
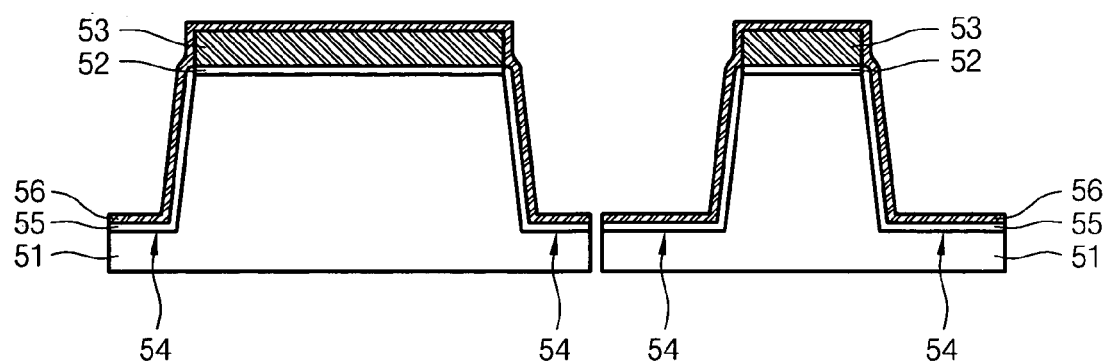
FIGS. 5A to 5F are sectional view illustrating a procedure for fabricating a transistor according to one embodiment of the present invention.

Referring to FIG. 5A, a pad oxide layer 52 and a pad nitride layer 53 are sequentially formed on a silicon substrate 51 having an isolation area and an active area in such a manner that the pad oxide layer 52 and the pad nitride layer 53 play the role of a first etch mask. Then, a photoresist pattern (not shown) is formed on the pad nitride layer 53 for exposing the isolation layer to an exterior, and then, the pad nitride layer 53 formed below the photoresist pattern is etched. At this time, the photoresist pattern plays the role of an etch barrier.

After that, the pad oxide layer 52 and the silicon substrate 51 are etched by using the etched pad nitride layer 53 as an etch mask, thereby forming a trench 54 having a depth of about 2000 to 3500 Å in the isolation area of the silicon substrate 51. While the etching process is being carried out, the photoresist pattern is completely removed from the pad nitride layer 53. After that, a sidewall oxide layer 55 having a thickness of about 30 to 300 Å is formed on sidewalls and a bottom of the trench 53 as a first insulation layer. Then, a linear nitride layer 56 having a thickness of about 20 to 150 Å is formed on an entire surface of the silicon substrate including the sidewall oxide layer 55.

Figure 5B:
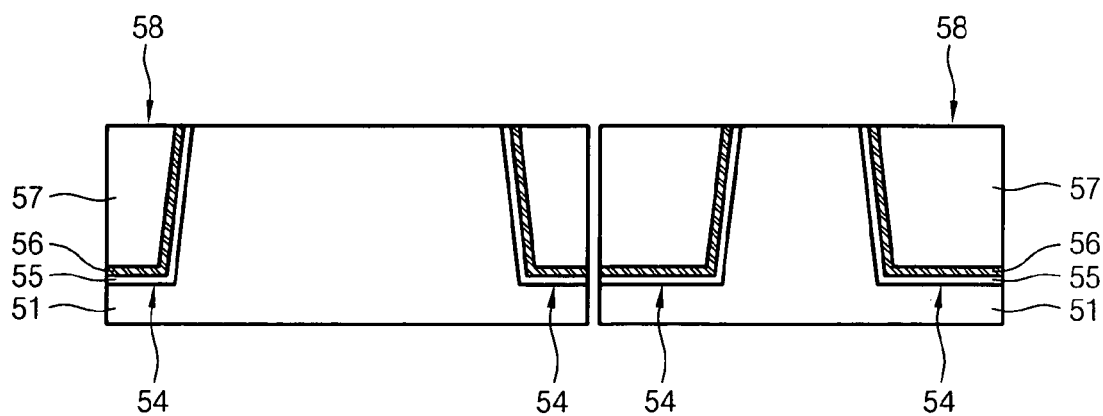

Referring to FIG. 5B, a buried oxide layer 57 having a thickness of about 2500 to 6000 Å is formed on the linear nitride layer 56 as a second insulation layer in such a manner that the trench 54 is filled with the buried oxide layer 57. The buried oxide layer 57 includes an HDP-oxide layer formed through an HDP-CVD process, an $O_3$-TEOS oxide layer or an SOG layer having superior trench-filling characteristics.

After that, the buried oxide layer 57 is subject to a chemical mechanical polishing (hereinafter, referred to as CMP) process until the pad nitride layer is exposed to an exterior. Then, the pad nitride layer and the pad oxide layer are sequentially removed, thereby forming a trench type isolation layer 58, in which the buried oxide layer 57 is sequentially surrounded by means of the linear nitride layer 56 and the sidewall oxide layer 55.

Figure 5C:
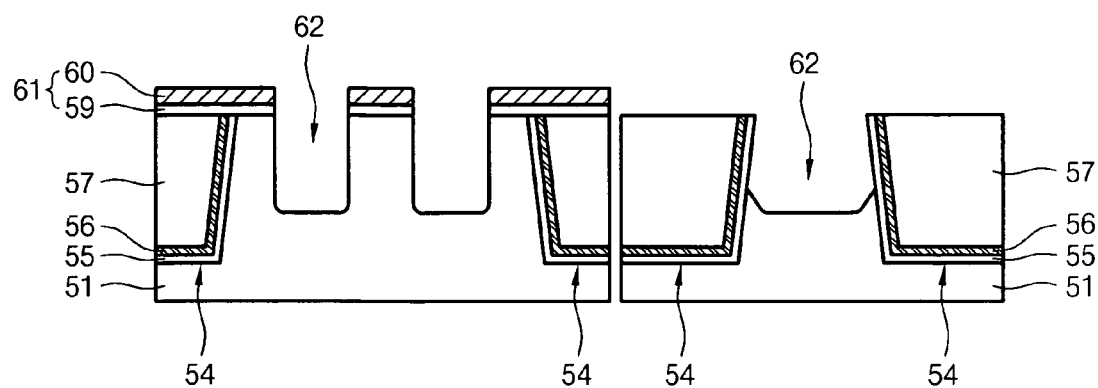

Referring to FIG. 5C, after sequentially forming an oxide layer 59 and a polysilicon layer 60 on the entire surface of the silicon substrate 51 including the isolation layer 58, the polysilicon layer 60 and the oxide layer are patterned through a conventional process, thereby forming a second etch mask 61 for exposing a predetermined portion of the silicon substrate 51, which will be determined as a channel area and formed in an active area of the silicon substrate 51 defined by the isolation layer 58. At this time, the second etch mask 61 has a line-shaped open area in such a manner that that the second etch mask 61 may expose not only the predetermined channel area of the active area, but also an isolation layer on which a gate will be positioned. Accordingly, the oxide layer 59 and the polysilicon layer 60 cannot be seen in the right part of FIG. 5C.

Thereafter, a recess 62 having a predetermined depth is formed by etching the predetermined channel area of the silicon substrate 51 exposed to the exterior. At this time, the depth of the recess 62 is smaller than that of the trench 54. For instance, the depth of the recess 62 is smaller than that of the trench 54 by at least 200 Å. In detail, the recess 62 has the depth corresponding to ½ to ⅘ of the depth of the trench 54.

Figure 5D:
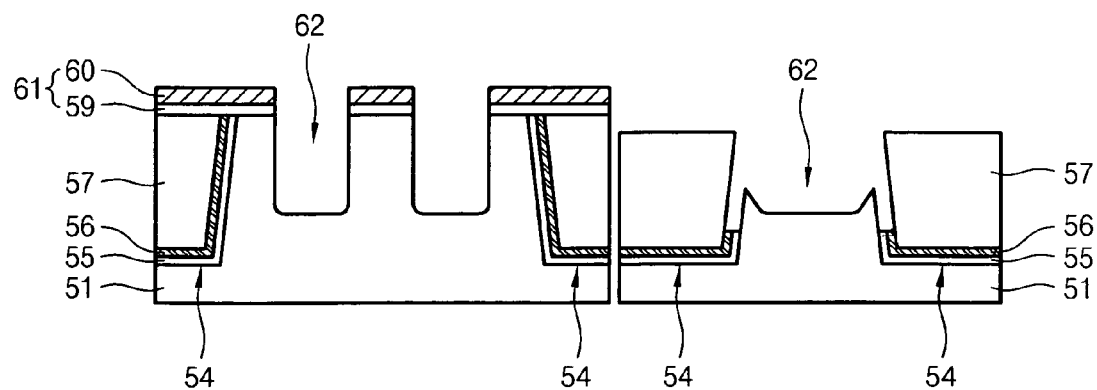

Referring to FIG. 5D, a primary wet etching process is carried out with respect to the resultant substrate structure by using etchant, such as HF or BOE, used for removing the oxide layer, thereby removing a part of the sidewall oxide layer surrounding a lateral portion of the buried oxide layer 57. Preferably, the primary wet etching process causes the sidewall oxide layer 55 remaining on a sidewall of the buried oxide layer 57 to be positioned below a bottom of the recess 62. That is, the sidewall oxide layer 55 is positioned lower than the bottom of the recess 62 by a distance of about 100 to 1000 Å.

While the primary wet etching process is being carried out, a predetermined portion of the buried oxide layer, which is not covered with the second etch mask 61, is also removed. That is as shown in the right part of FIG. 5D, the surface of the buried oxide layer is partially removed by a thickness of about 100 to 500 Å.

After the primary wet etching process has been completed, a secondary wet etching process is carried out with respect to the resultant substrate structure by using etchant, such as $H_3PO_4$, which is used for removing the nitride layer, thereby removing a predetermined portion of the linear nitride layer surrounding a lateral portion of the buried oxide layer 57 in the isolation layer 58. Similarly to the primary wet etching process, the secondary wet etching process causes the linear nitride layer 56 remaining on a sidewall of the buried oxide layer 57 to be positioned below the bottom of the recess 62. That is, the linear nitride layer 56 is positioned lower than the bottom of the recess 62 by a distance of about 100 to 1000 Å.

Figure 5E:
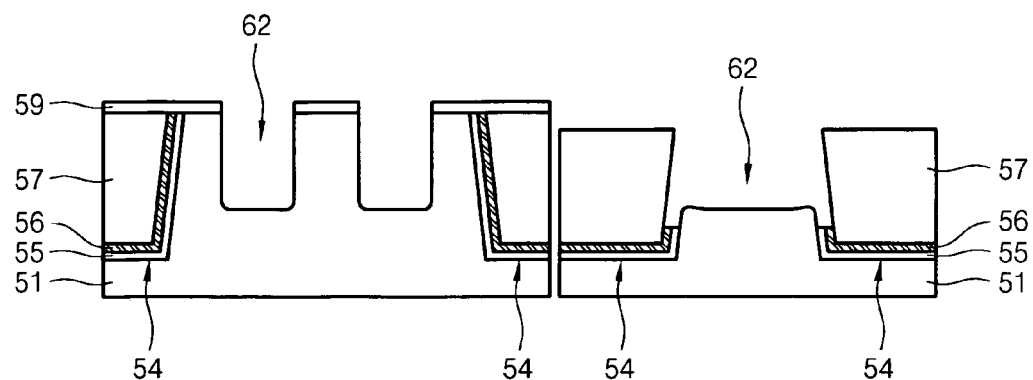

Referring to FIG. 5E, after the primary and secondary wet etching processes have been completed, a silicon etching process is carried out with respect the resultant substrate structure in such a manner that corner edges formed at the bottom of the recess 62 can be blunted. If the corner edges of the recess 62 are sharpened, the electric field is concentrated onto the corner edges of the recess 62, so that the threshold voltage of the transistor may be lowered. In order to prevent the above phenomenon, the corner edges formed at the bottom of the recess 62 are blunted.

In addition, while the silicon etching process is being carried out, the polysilicon layer remaining in the second etch mask may be simultaneously removed. Thus, it is not necessary to additionally perform the etching process for removing the polysilicon layer.

Figure 5F:
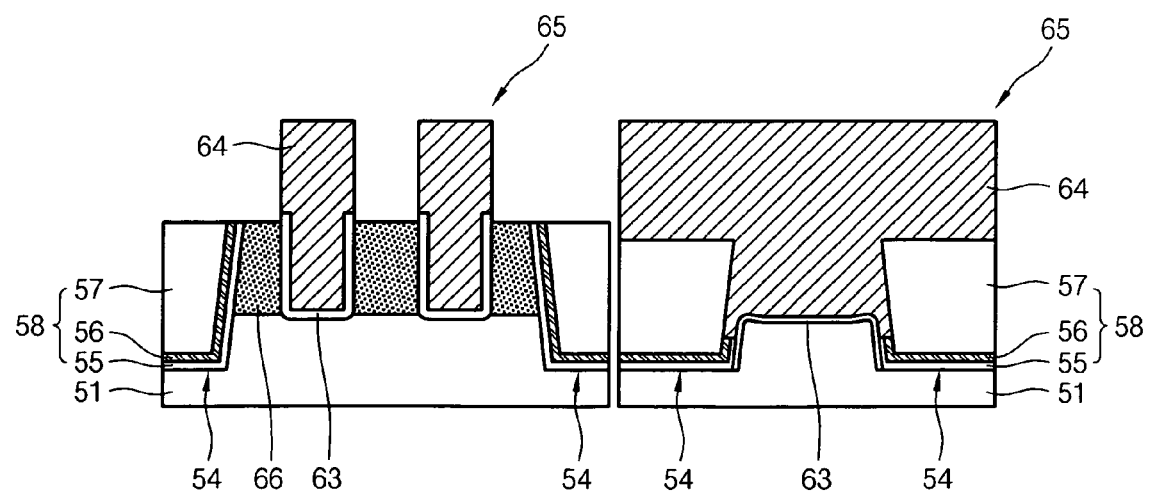

Referring to FIG. 5F, after removing the oxide layer remaining in the second etch mask, a gate insulation layer 63 and a gate conductive layer 64 are sequentially deposited on the resultant substrate structure. At this time, the gate insulation layer 63 includes one selected from the group consisting of a Si oxide layer, an Hf oxide layer, an Al oxide layer and a nitride layer. In addition, the gate conductive layer 64 includes at least one selected from the group consisting of a polysilicon layer, a tungsten layer, a tungsten silicide layer, a titanium nitride layer and a tungsten nitride layer.

After that, the gate conductive layer 64 and the gate insulation layer 63 are etched, thereby forming a recess gate 65 in the recess 62. Then, source/drain on implantation is carried out with respect to the resultant substrate structure, thereby forming a junction area 66 at both sides of the recess gate 65 aligned on the upper surface of the substrate. As a result, the transistor according to the present invention is obtained.

As mentioned above, the present invention performs the primary and secondary wet etching processes after forming the recess 62 in the silicon substrate, so that predetermined portions of the sidewall oxide layer exposed through the recess 62 and the linear nitride layer formed on the sidewall oxide layer can be removed. Accordingly, the sidewall oxide layer 55 and the linear nitride layer 56 may be positioned lower than the bottom of the recess 62 by a distance of about 100 to 1000 Å. Thus, the recess 62 and the recess gate 65 formed on the sidewall oxide layer 55 and the linear nitride layer 56 may have the three-dimensional structure.

Therefore, the channel length and the channel width of the transistor according to the present invention may be lengthened corresponding to the recess gate 65 formed in the sidewall oxide layer 55 and the linear nitride layer 56, so that the threshold voltage of the transistor may rise and the driving current of the transistor may increase.

Although the present invention has been described in that the sidewall oxide layer and the linear nitride layer formed at the lateral portion of the buried oxide layer are removed through the primary and secondary wet etching processes, it is also possible to selectively remove the sidewall oxide layer by performing only the primary wet etching process using the etchant for removing the oxide layer.

In this case, the recess gate is formed on the sidewall oxide layer, so that the recess gate may have the three-dimensional structure. Accordingly, the channel length and the channel width of the transistor may be lengthened, so the threshold voltage of the transistor may rise and the driving current of the transistor may increase.

In addition, although the present invention has been described in that the stacked structure including the sidewall oxide layer and the linear nitride layer is used as the first insulation layer, it is also possible to form the first insulation layer by using the linear nitride layer without employing the sidewall oxide layer. In this case, differently from the above-mentioned embodiments, the linear nitride layer (that is, the first insulation layer) preferably has a thickness in a range of about 100 to 600 Å. In addition, when performing the wet etching process with respect to the first insulation layer (that is, the linear nitride layer), the surface of the buried oxide layer is rarely etched. Furthermore, the wet etching process for removing the sidewall oxide layer can be omitted.

In this case, the channel length and the channel width of the transistor may be lengthened corresponding to the recess gate formed in the linear nitride layer, so that the threshold voltage of the transistor may rise and the driving current of the transistor may increase.

As described above, according to the present invention, the channel length and the channel width of the transistor can be three-dimensionally increased by etching the silicon substrate, the sidewall oxide layer and the linear nitride layer, so the threshold voltage of the transistor may significantly rise and the driving current of the transistor may be effectively increased.

In addition, since the threshold voltage of the transistor is sufficiently increased, it is possible to reduce the ion implantation dose if the transistor having the increased channel length and channel width is applied to the DRAM device. Accordingly, the junction leakage current is reduced, so sufficient data retention time may be ensured.

Moreover, since the present invention may increase the driving current of the transistor, the operational speed of the semiconductor device can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:
1. A transistor comprising:
a silicon substrate having:
    an active area including:
        a channel having
        a channel length;
            a channel width; and
            a recess including:
                a recess depth;
                a recess bottom; and
                rounded corner edges at the recess bottom;
        a gate on top of the channel and formed in the recess; and
        a gate insulation layer between the gate and the channel wherein the gate insulation layer is positioned on the recess bottom in which a portion of the gate insulation layer covers over the rounded corner edges at the recess bottom such that part of the gate extends below the portion of the gate insulation layer that covers over the rounded corner edges of the recess bottom; and
    an isolation area including:
        a trench having:
            a trench depth;
            a trench bottom; and
            a lower sidewall;
        an oxide layer and a nitride layer formed on the trench bottom and on the lower sidewall of the trench; and
        an insulation layer formed on the nitride layer and filling the trench, wherein
            the recess depth is smaller than the trench depth,
            an edge of the oxide layer and the nitride layer is positioned lower than the recess bottom,
            the channel length and the channel width of the transistor are increased corresponding to the gate formed above the oxide layer and the nitride layer,
            a portion of the gate insulating layer is positioned below all portions of the gate, and the rounded corner edges contribute to raising the transistor's threshold voltage, and wherein the oxide layer, the nitride layer and the gate insulation layer form a triple contiguous layer immediately between an adjacent connecting portion of the insulation layer of the trench and an adjacent connection portion the channel.

2. The transistor as claimed in claim 1, wherein the trench depth being about 2000 to 3500 Å.

3. The transistor as claimed in claim 1, wherein the oxide layer has a thickness of about 30 to 300 Å and the nitride layer has a thickness of about 20 to 150 Å.

4. The transistor as claimed in claim 1, wherein the insulation layer includes an oxide layer.

5. The transistor as claimed in claim 1, wherein the recess depth being smaller than the trench depth by at least 200 Å.

6. The transistor as claimed in claim 1, wherein the recess depth corresponding to ½ to ⅘ of the trench depth.

7. The transistor as claimed in claim 1, wherein the edge of the oxide layer and the nitride layer is positioned lower than the recess bottom by a distance of about 100 to 1000 Å.

* * * * *